United States Patent
Pyeon

(10) Patent No.: US 7,577,059 B2
(45) Date of Patent: Aug. 18, 2009

(54) DECODING CONTROL WITH ADDRESS TRANSITION DETECTION IN PAGE ERASE FUNCTION

(75) Inventor: Hong Beom Pyeon, Kanata (CA)

(73) Assignee: Mosaid Technologies Incorporated, Kanata, Ontario (CA)

(*) Notice: Subject to any disclaimer, the term of this patent is extended or adjusted under 35 U.S.C. 154(b) by 231 days.

(21) Appl. No.: 11/711,043

(22) Filed: Feb. 27, 2007

(65) Prior Publication Data

US 2008/0205164 A1    Aug. 28, 2008

(51) Int. Cl.
G11C 7/10    (2006.01)

(52) U.S. Cl. ............... 365/238.5; 365/230.05; 365/230.06; 365/230.01; 365/230.08; 365/235; 365/185.29; 365/185.33; 365/185.11; 365/185.12; 711/119; 711/149

(58) Field of Classification Search ............ 365/230.05, 365/230.06, 230.01, 230.08, 235, 238, 185.29, 365/185.33, 185.11, 185.125; 711/119, 149
See application file for complete search history.

(56) References Cited

U.S. PATENT DOCUMENTS

| | | | |
|---|---|---|---|
| 5,109,361 A | 4/1992 | Yim et al. |
| 5,270,980 A | 12/1993 | Pathak et al. |
| 5,278,785 A | 1/1994 | Hazani |
| 5,299,162 A | 3/1994 | Kim et al. |
| 5,365,484 A | 11/1994 | Cleveland et al. |
| 5,473,563 A | 12/1995 | Suh et al. |
| 5,541,879 A | 7/1996 | Suh et al. |
| 5,546,341 A | 8/1996 | Suh et al. |
| 5,671,178 A | 9/1997 | Park et al. |
| 5,732,018 A | 3/1998 | Choi et al. |
| 5,805,510 A | 9/1998 | Miyakawa et al. |
| 5,835,935 A | 11/1998 | Estakhri et al. |
| 5,847,994 A | 12/1998 | Motoshima et al. |
| 5,886,923 A | 3/1999 | Hung |
| 5,937,425 A | 8/1999 | Ban |
| 5,995,417 A | 11/1999 | Chen et al. |
| 6,026,021 A | 2/2000 | Hoang |
| 6,107,658 A | 8/2000 | Itoh et al. |
| 6,111,787 A | 8/2000 | Akaogi et al. |
| 6,118,705 A | 9/2000 | Gupta et al. |
| 6,208,556 B1 | 3/2001 | Akaogi et al. |
| 6,230,233 B1 | 5/2001 | Lofgren et al. |
| 6,256,254 B1 | 7/2001 | Kwak et al. |
| 6,359,810 B1 | 3/2002 | Gupta et al. |
| 6,594,183 B1 | 7/2003 | Lofgren et al. |

(Continued)

OTHER PUBLICATIONS

Hara, T. et al. "A 146mm2 8Gb NAND Flash Memory with 70 nm CMOS Technology" ISSCC Session 2 Non-Volatile Memory 2.1, IEEE International Solid-State Circuits Conference, Feb. 2005, pp. 44, 45 and 584.

(Continued)

*Primary Examiner*—Pho M. Luu
*Assistant Examiner*—Eric Wendler

(57) ABSTRACT

Circuits and methods are provided for controlling multi-page erase operations in flash memory. The page address of each address of a multi-page erase operation is latched in wordline decoders. A page select reset generator circuit processes the block addresses of each address of the multi-page erase operation. In the event the addresses relate to pages in different blocks, then previously latched page addresses are reset. This avoids the incorrect circuit operation that will result should a multi-page erase operation include multiple pages in different blocks.

20 Claims, 12 Drawing Sheets

U.S. PATENT DOCUMENTS

| | | | |
|---|---|---|---|
| 6,732,116 | B2 | 5/2004 | Lee et al. |
| 6,732,221 | B2 | 5/2004 | Ban |
| 6,763,424 | B2 | 7/2004 | Conley |
| 6,804,148 | B2 | 10/2004 | Bedarida et al. |
| 6,807,103 | B2 | 10/2004 | Cavaleri et al. |
| 6,850,443 | B2 | 2/2005 | Lofgren et al. |
| 6,862,222 | B2 | 3/2005 | Roohparvar |
| 6,885,583 | B2 | 4/2005 | Tanaka |
| 6,940,759 | B2 * | 9/2005 | Tsang et al. ........... 365/185.29 |
| 6,958,940 | B2 * | 10/2005 | Takase et al. .......... 365/185.29 |
| 7,161,842 | B2 | 1/2007 | Park |
| 2004/0015663 | A1 * | 1/2004 | Choi ........................ 711/154 |
| 2006/0050594 | A1 | 3/2006 | Park |
| 2006/0133155 | A1 | 6/2006 | Fujita et al. |
| 2006/0256623 | A1 | 11/2006 | Roohparvar |
| 2006/0291289 | A1 | 12/2006 | Lee |

OTHER PUBLICATIONS

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Tanaka, T. et al., "A quick Intelligent Page-Programming Architecture and a Shieldedbitline sensing method for 3 V Only NAND Flash Memory", IEEE Journal of Solid-State Circuits, vol. 29, Issue 11, Nov. 1994, pp. 1366-1373.

Lee, J. et al., "High Performance 1-Gb NAND Flash Memory with 0.12-m Technology", IEEE Journal of Solid State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications", IEEE Journal of Solid-State Circuits, vol. 31, No. 11, Nov. 1996, pp. 1575-1583.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Samsung Electronics Co. Ltd, "1G×8 Bit/2G×8 Bit/ 4G×8 Bit NAND Flash Menory", K9XXG08UXA, Jul. 18, 2006, pp. 1-50.

Samsung Electronics Co. Ltd, "2G×8 Bit NAND Flash Memory", K9GAG08U0M, Apr. 12, 2006, pp. 1-48.

Toshiba, "16 GBIT (2G×8 Bit) CMOS NAND E2PROM (Multi-Level-Cell)", TC58NVG4D1DTG00, Nov. 9, 2006.

Intel Corporation, "Intel® Advanced+Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Cata Sheet, Rev. 0.5 (Preliminary), pp. 1-66, 2005.

Samsung Electronics Co. Ltd, OneNAND4G (KFW4G16Q2M-DEB6), OneNAND2G (KFH2G16Q2M-DEB6), OneNAND1G (KFW!G16Q2M-DEB6) Flash Memory, One NAND™ Specification Ver. 1.2, pp. 1-125, Dec. 23, 2005.

Intel Corporation, "Intel Strataflash Wireless Memory (L18)", Order No. 251902, Revision 010, Aug. 2005.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 1995.

Kirisawa et al., "A NAND Structured Cell with a New Programming Technology", IEEE, 1990, pp. 129-130.

Aritome et al., "A Reliable Bi-Polarity Write/Erase Technology in Flash EEProms", IEEE, 1990, pp. 5.6.1-5.6.4.

Shirota et al., "A 2.3um2 Memory Cell Structure for 16Mb NAND EEProms", IEEE, 1990, pp. 5.4.1-5.4.4.

Momodomi et al., "A 4-Mb NAND EEProm with Tight Programmed Vt Distribution", IEEE, 1991, pp. 492-496.

Kim et al., "A 120-mm2 64-Mb NAND Flash Memory Achieving 180 ns/Byte Effective Program Speed", IEEE, 1997, pp. 670-680.

Suh et al., "A 3.3 32 Mb NAND Flash Memory with Incremental Step Pulse Programming Scheme", IEEE, 1995, pp. 1149-1156.

Imamiya et al., "A 125-mm2 1-Gb NAND Flash Memory with 10-Mbyte/s Program Speed", IEEE Journal of Solid-State Circuits, vol. 37, No. 11, Nov. 2002, pp. 1493-1501.

Takeuchi et al., "A 56nm CMOS 99 mm2 8 Gb Multi-level NAND Flash Memory with 10 MB/s Program Throughput", IEEE International Solid-State Circuits Conference, 2006, pp. 144-146.

Samsung Electronics Product Information 256M×8 Bit/ 28×16 Bit/ 512×8 Bit NAND Flash Memory, pp. 1-41.

Gal et al., "Algorithms and Data Structures for Flash Memories", ACM Computing Surveys, vol. 37, No. 2, Jun. 2005, pp. 138-163.

Lee et al., "A 90-nm CMOS 1.8-V 2-Gb NAND Flash Memory for Mass Storage Applications", IEEE Journal of Solid-State Circuits, vol. 38, No. 11, Nov. 2003, pp. 1934-1942.

Toshiba Product Information "Toshiba MOS Digital Integrated Circuit Silicon Gate CMSOS", May 19, 2003, pp. 1-32.

* cited by examiner

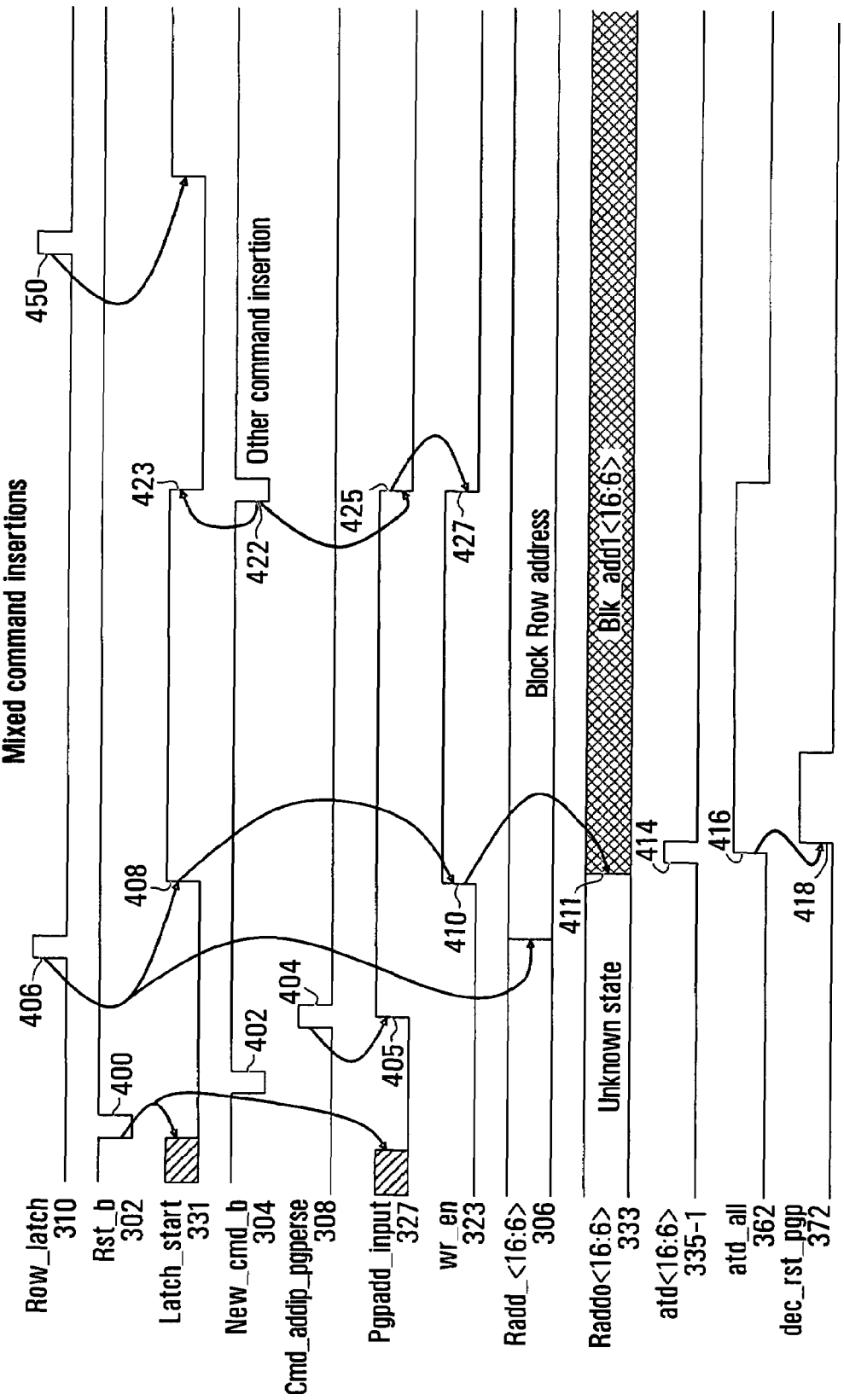

DECODING CONTROL WITH ADDRESS TRANSITION DETECTION IN PAGE ERASE FUNCTION

FIELD OF THE INVENTION

The invention relates to page erase functions in flash memories.

BACKGROUND OF THE INVENTION

An erase function is used in non-volatile flash memory to restore the original state of a flash cell. Due to physical limitations of the erase operation, it takes a long time to complete the operation. The erase operation takes relatively longer than other main operations such as a page program. For example, where the erase time might be 1.5 ms, the page program time might be 25 us. With a block erase operation, an entire block is erased at once, a block consisting of a set of pages (rows). Because of this, block erase needs to backup the contents to another memory medium before erasing all contents in the selected block at the same time so as to enable some of the contents (certain pages) to be restored assuming some of the contents of the block should be kept. This requires another memory system to be incorporated in the same board or the same package to support the mentioned data restoration of flash memory. This increases the total system cost with flash memory and makes the data control more complicated.

SUMMARY OF THE INVENTION

According to one broad aspect, the invention provides a page select reset generator circuit for limiting multi-page erase operations in non-volatile memory, the page select reset generator circuit comprising: an input for receiving block address portions of each address of a set of one or more addresses; an address transition detect circuit that detects when block address portions of two addresses of the set of page addresses are different; the page select reset generator being operable to generate a reset output for clearing latched pages upon detecting that block address portions of two addresses are different.

In some embodiments, the page select reset generator circuit is for limiting multi-page erase operations in non-volatile memory that is flash memory.

In some embodiments, the page select reset generator circuit further comprises: a first page select reset enable circuit that enables the generation of the reset output when the addresses are in respect of multi-page erase operation.

In some embodiments, the page select reset generator circuit further comprises: a second page select reset enable circuit that enables the generation of the reset output timed properly with the latching of addresses in main address registers.

In some embodiments, the page select reset generator circuit further comprises: a first page select reset enable circuit that enables the generation of the reset output when the page addresses are in respect of multi-page erase operation; a second page select reset enable circuit that enables the generation of the reset output timed properly with the latching of addresses in main address registers; wherein the page select reset generator is operable to generate the reset output only when enabled by both the first page select reset enable circuit and the second page select reset enable circuit.

In some embodiments, the address transition detect circuit comprises: for each bit of a multi-bit block address: a) a respective sub-address register for registering the bit and producing a registered address output; b) a respective bitwise address detection circuit for detecting a transition in the registered address output; a merger circuit for combining outputs of the bitwise address detection circuits.

In some embodiments, each bitwise address detection circuit comprises: a first circuit for detecting rising address transitions; a second circuit for detecting falling address transitions; a circuit for combining outputs of the first circuit and the second circuit.

In some embodiments, the first circuit for detecting rising address transitions comprises: a) an inverter and a delay element connected together in sequence; b) a NAND gate having a first input connected to receive one of the registered address outputs, the NAND gate having a second input connected to receive the one of the registered address outputs after inversion by the inverter and delay by the delay element; the second circuit for detecting falling address transitions comprises: a) an inverter and a delay element; b) a NAND gate having a first input connected to receive one of the registered address outputs after inversion by the inverter, the NAND gate having a second input connected to receive the one of the registered address outputs after delay by the delay element.

In some embodiments, for each bit of the multi-bit block address, the respective sub-address register comprises: an SR latch having an input connected to receive the bit; an enable circuit for enabling latching of the bit to the SR that enables the generation of the reset output when the page addresses are in respect of multi-page erase operation.

In some embodiments, the page select reset generator circuit further comprises: a main reset pulse generator circuit.

According to another broad aspect, the invention provides a memory circuit comprising: a plurality of memory blocks, each block comprising non-volatile memory cells arranged in a plurality of pages; a respective latching circuit for each page, each page having a page address, the page addresses of the pages being unique within each block, the page address of each page being the same as that of a corresponding page in each other block; a respective block enable circuit for each block; a block pre-decoder circuit that processes a block address portion of each address of a page erase command by enabling the block enable circuit for the block identified by the block address portion of the address; a page pre-decoder circuit that processes a page address portion of each address of a page erase command by setting the latching circuit for each page having the page address identified by the address portion; the page select reset generator circuit as summarized above; the latching circuits being further operable to connect an erase voltage to the selected pages of the enabled blocks after all addresses of the page erase command have been processed by the block pre-decoder, the page pre-decoder, and the page select reset generator circuit; wherein accidental erasure of pages due to a multi-page erase operation relating to two or more different block addresses is prevented.

In some embodiments, the non-volatile memory is flash memory.

In some embodiments, the latching circuits have a commonly connected reset input for receiving the reset output generated by the page select reset generator.

According to another broad aspect, the invention provides a method comprising: for each of a plurality of addresses of a multi-page erase operation pertaining to a non-volatile memory, each address containing a block address portion and a page address portion: a) detecting whether the block address portion differs from that of a previous address of the plurality of addresses; b) resetting any previous selections of pages and blocks upon detecting that the block address differs from that of a previous address of the plurality of addresses; c) selecting a respective page in each of a plurality of blocks; d) selecting a respective one of the plurality of blocks; and wherein after said detecting, resetting, selecting a respective page and selecting a respective one of the plurality of blocks on each address, a single remaining block address will be selected, the method further comprising erasing any selected pages in the single remaining selected block.

In some embodiments, the method further comprises: generating a reset output to reset the previous selections.

In some embodiments, the method further comprises: receiving addresses, each address containing a block portion and a page address portion; for each received address, determining if the address is part of a page erase operation; performing said detecting and resetting only if the address is determined to be part of a page erase operation.

In some embodiments, the method further comprises: latching addresses in main address registers; timing the generation of the reset output with the latching of addresses in main address registers.

In some embodiments, detecting whether the block address portion differs from that of a previous address of the plurality of addresses comprises: for each bit of a multi-bit block address: a) registering the bit into a respective sub-address register; b) performing bitwise address detection to detect a transition in an output of the sub-address register; combining outputs of the bitwise address detection.

In some embodiments, performing bitwise address detection comprises: detecting rising address transitions; and detecting falling address transitions.

In some embodiments, the method is applied to flash memory.

BRIEF DESCRIPTION OF THE DRAWINGS

Embodiments of the present invention will now be described, by way of example only, with reference to the attached figures, wherein:

FIG. 11 is a second example of the operation of the circuit of FIG. 9 for consecutive commands that are not both page addresses.

DETAILED DESCRIPTION

Because of the limitations of block erase, page based erase has been introduced as an alternative of block erase operation in flash memories. Examples are described in commonly-assigned co-pending U.S. Provisional Patent Application Ser. No. 60/786,897 filed Mar. 29, 2006 and Ser. No. 60/843,593 filed on Sep. 11, 2006. Block erase still has an application to erase an entire block. The block and page erase functions can coexist in flash memory operations. For a multiple block erase operation, there is no restriction on the selection of blocks to erase simultaneously. Flash memory applications are mainly used in density oriented markets, such as cameras, data storage, portable audio and video players so that cell density is critical and small peripheral and decoder blocks are mandatory. In flash memory systems, it is often a goal to simplify and minimize the amount of circuitry peripheral to the memory core. Because of this, in flash memory systems typically page selection decoding signals are commonly connected to all blocks with global decoding. In such a system, if there is page erase with different block addresses, unwanted pages in different blocks can be deleted accidentally. An example of this incorrect operation is detailed below.

Figure 1:
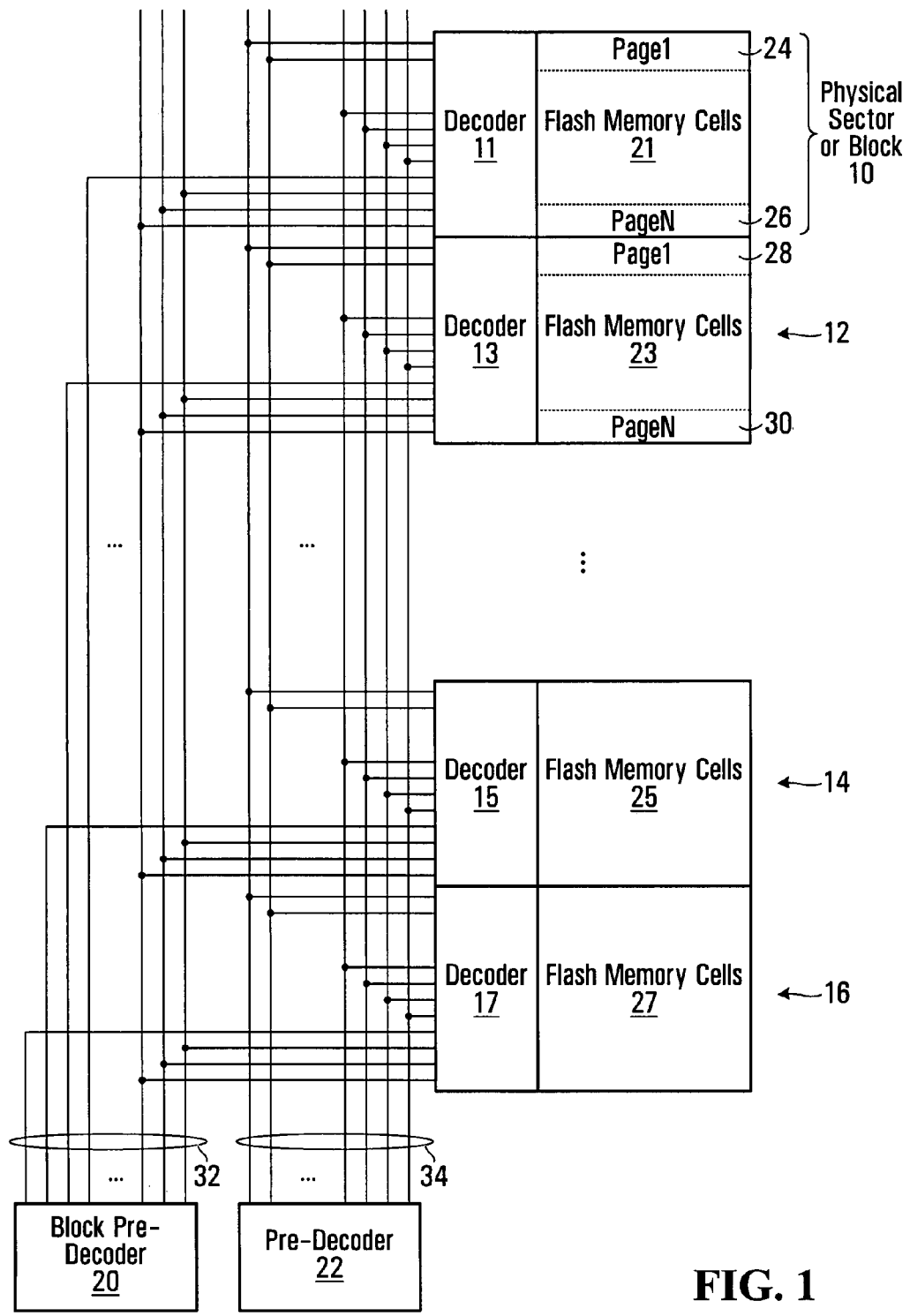
FIG. 1 is a schematic diagram of a flash memory system.

FIG. 1 shows an arrangement of flash memory cells in which there are physical sectors or blocks 10, 12, ..., 14, 16, each with flash memory cells 21, 23, 25, 27 and a respective decoder 11, 13, ..., 15, 17. The memory cells of each block are composed of a set of pages (rows). Page1 24 and pageN 26 are shown for block 10, and page1 28 and pageN 30 are shown for block 12. A block pre-decoder 20 produces a set of block select outputs 32. One of the block select outputs and commonly shared signals 32 are connected to each of the blocks. There is also shown a pre-decoder 22 having a set of page select outputs 34. The page select outputs 34 are commonly connected to all of the blocks 10, 12, ..., 14, 16. In operation, block pre-decoder 20 generates block select signals 32 to select particular subsets of the blocks 10, 12, 14, 16. The pre-decoder 22 generates page select outputs 34 that select particular pages. Once this is done, an erase operation will erase the selected pages from the selected blocks.

Figure 2:
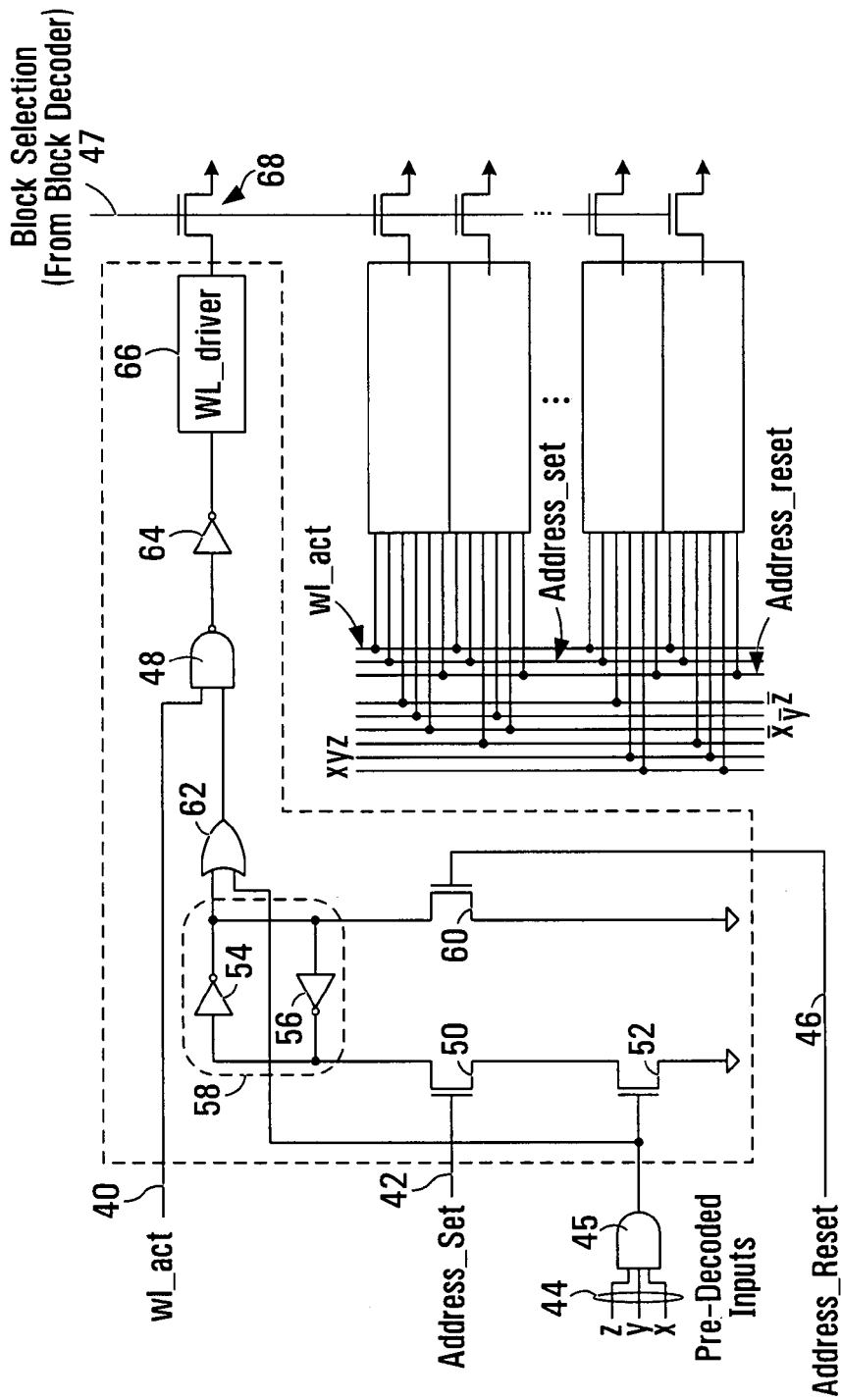
FIG. 2 is a circuit diagram of a decoder circuit for flash memory cells.

FIG. 2 shows a detailed latch structure to have a multiple page erase function in the core block with a row address decoder. The structure of FIG. 2 forms part of the decoders 11, 13, ..., 15, 17 of FIG. 1, and is replicated for each page. The circuit has inputs consisting of wl_act (wordline active=pageline active) 40, Address_Set 42, pre-decoded inputs X, Y, Z 44 (outputs of pre-decoder 22 of FIG. 1), Address_Reset 46, and block selection 47 (one of the block selection signals 32 from block decoder 20 of FIG. 1). The input wl_act is input as a first input to a NAND gate 48. Address_Set 42 is connected to the gate of a transistor 50. The pre-decoded inputs X, Y, Z 44 are input to a three input AND gate 45 the output of which is connected to the input of another transistor 52 and to an input of OR gate 62. For this example, for a given page, X is connected to receive x or $\bar{x}$, Y is connected to receive y or $\bar{y}$, and Z is connected to receive z or $\bar{z}$, where x, $\bar{x}$, y, $\bar{y}$, z and $\bar{z}$ are outputs of the pre-decoder. Each page has a different set of connections to the pre-decoder outputs so that they can be individually selected. The decoder circuits for corresponding pages of all of the blocks have the same pre-decoded inputs. Address_Reset 46 is connected to the gate of another transistor 60. Inverters 54, 56 are connected to form a set-reset (SR) latch 58. The output of the set-reset latch 58 is connected to another input of the OR gate 62 the output of which is connected as a second input to the NAND gate 48. The output of the NAND gate 48 passes through inverter 64 to WL_driver 66. The output of WL_driver 66 passes through block selection transistor 68 that is enabled (or not) by the block selection input 47. The block selection input is the same for all the pages of a given block, but is different for each block.

In operation, wl_act 40 needs to be high for any page erase operation. Set operation of the set-reset latch 58 is controlled by the Address_set 42 in combination with the output of AND gate 45. The output of AND gate 45 is high when the page select signals are appropriately set for that page. Both Address_set 42 and the output of AND gate 45 need to be high for a set operation to occur within the set-reset latch 58. The reset operation of the set-reset latch 58 is controlled by the Address_reset input 46. When Address_reset is high, a reset occurs. When the latch 58 is set, the output of OR gate 62 will go high. Assuming wl_act 40 is high, this will produce a high at the output of inverter 64 which goes through the driver 66. The output of WL_driver 66 will only be connected to the memory cells of that page if the corresponding block selection 47 from the block decoder is also high. WL driver 66 has a low value when erase is needed. 'H' (Vdd level, operating voltage) is non-select, and 'L' (Vss, ground level) is select. The erase voltage is applied to the substrate. (~20 v).

An example of a command structure that may be processed by the block decoder and pre-decoder is as follows:

{block $B_1$, page $P_1$}, {block $B_2$, page $P_2$}, . . . ,{block $B_K$, page $P_K$}, erase This means that in block $B_1$, page $P_1$ is to be erased, in block $B_2$, page $P_2$ is to be erased, and so on until block $B_K$, where page $P_K$ is to be erased. Each of these {block, page} pairs results in a set operation in the corresponding decoder logic for the block and page. After all the set operations are complete, the erase command is executed to perform the erase operation for the selected pages and blocks.

The circuit of FIG. 2 is repeated for each page. With this structure, each page address in a selected block is latched into the latch 58 of each word line decoding block, and multiple word lines to be erased can be selected during the address setting phase prior to when the erase function starts. Commonly connected row address decoders in each block, at the same time, are chosen by the pre-decoder and the block decoder. The page in the correct block is selected by driving the block selection 47 high on the selected block (to transistor 68 placed between the WL_driver 66 and memory cell blocks (not shown). Because of this, multiple page erase will work properly only if it is limited to erasing multiple pages within the same block.

Figure 3:
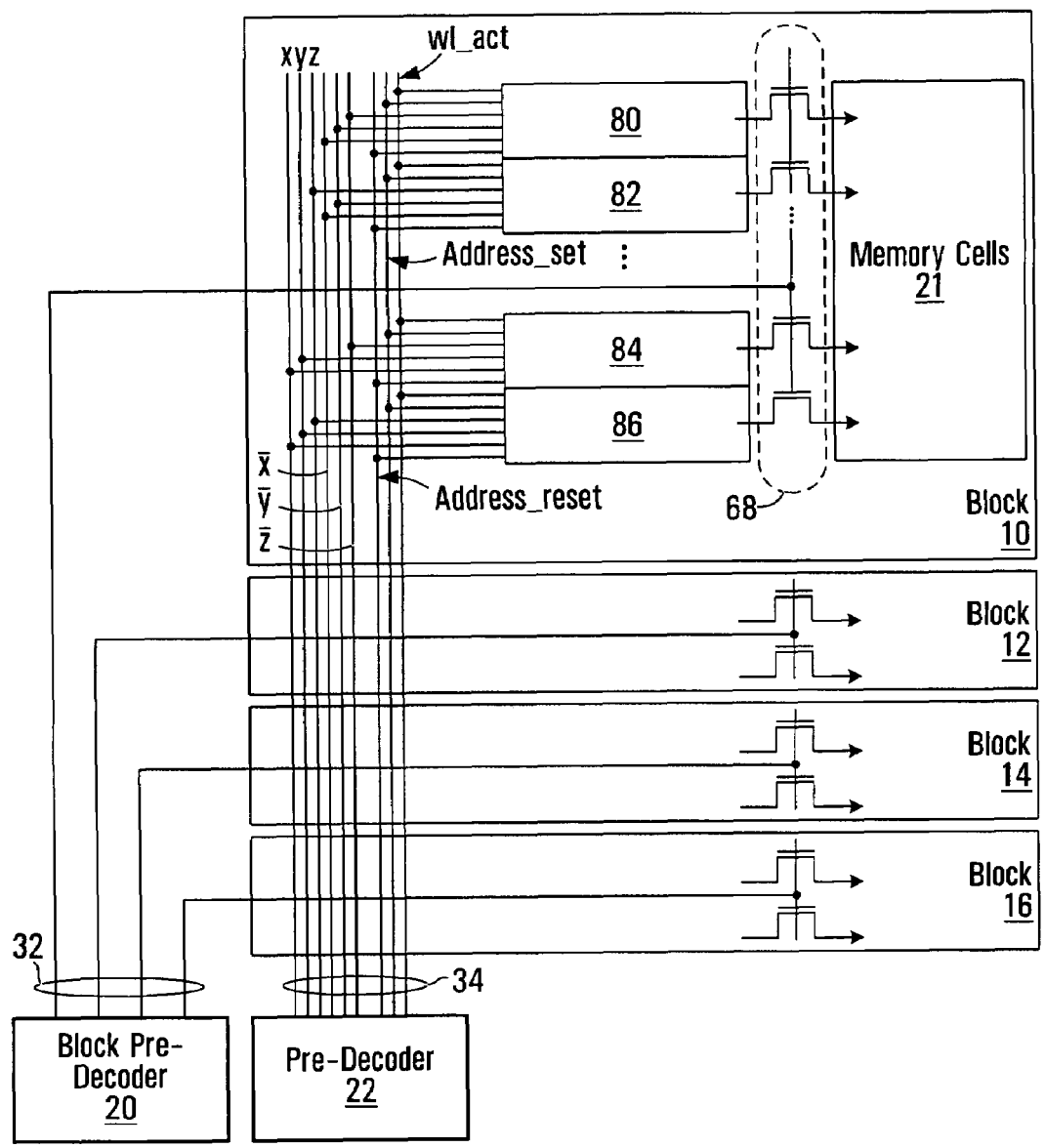
FIG. 3 is a circuit diagram of a flash memory system showing more detail of the block decoder connections.

FIG. 3 shows how a multiple page erase can work properly, when the multiple pages are all within the same block. FIG. 3 shows a different view of the circuit of FIG. 1. The block 10 has been expanded to show word line decoders 80, 82, 84, 86 (forming part of decoder 11 of FIG. 1) and memory cells 21. One of the block select outputs 32 is connected to the respective transistor 68 for each page. Multiple pages being selected will result in the corresponding word line decoders of every block being set. However, if the pages within only the first block 10 are to be erased, then the block select will enable only the first block 10, and as such, only pages within that block will be erased, and that is the desired result. The final selection is performed by transistors 68 acting as NMOS switches. The WL_drivers for the selected pages in all the blocks generate a page erase voltage (0V). This is only coupled through to the gate level of memory cells of selected blocks because only transistors 68 of selected blocks are switched on. In addition, 20V is applied to the substrate of the flash memory. Because of this reverse voltage between gate (0 v) and substrate (20 v), the trapped charge of the floating gate of each selected cell can be erased. For unselected cells, WL_driver generates Vdd. The floating level at the vdd applied page-line is boosted up by the substrate level (20 v) so that the gate of the unselected cell has roughly 16V, and no erase occurs.

Figure 4A:
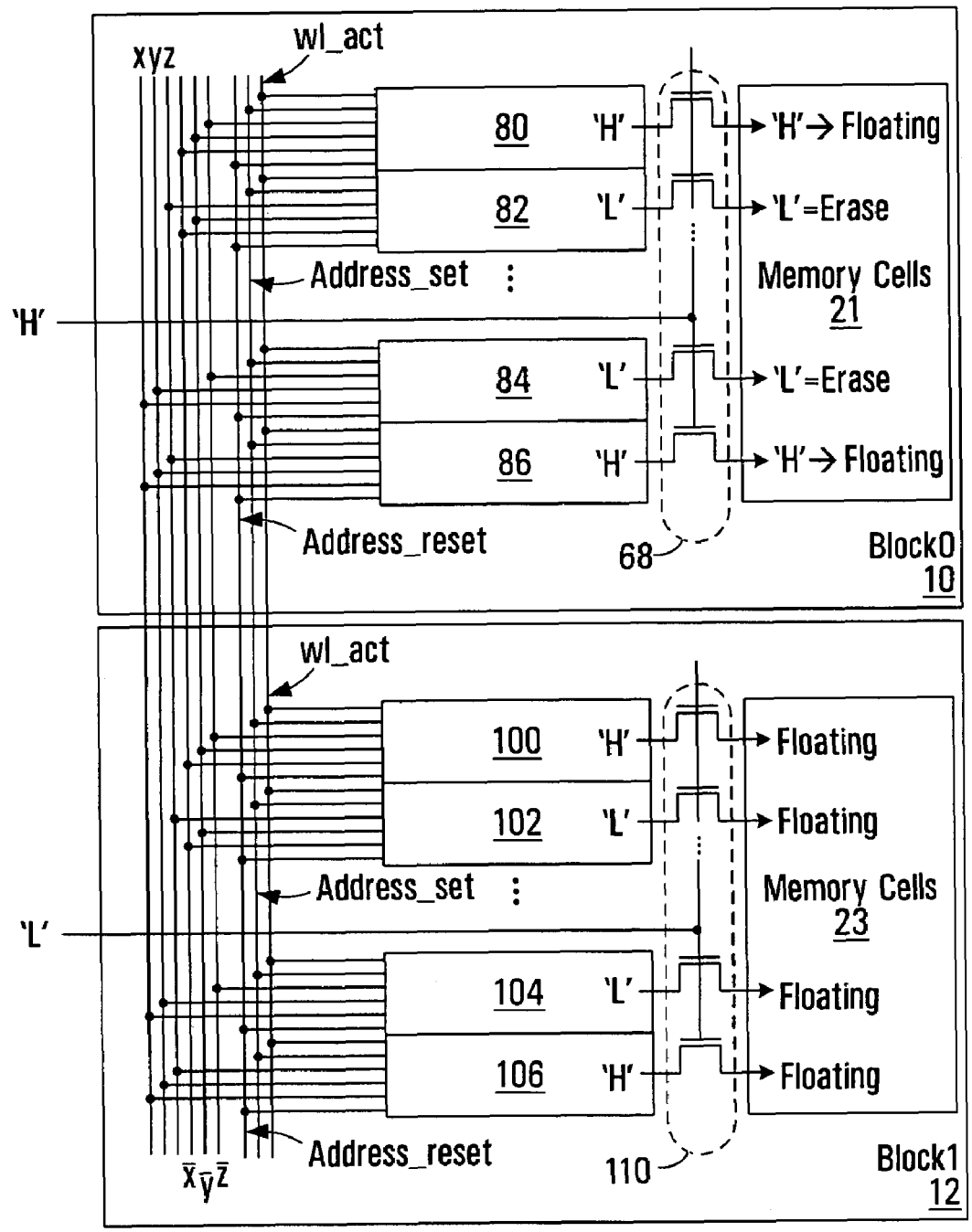
FIG. 4A is a circuit diagram of a flash memory system showing the behaviour when performing a multiple page erase within a single block.

FIG. 4A shows further details of how a multiple page erase can work properly, when the multiple pages are all within the same block. FIG. 4A shows a different view of the circuit of FIG. 1. The block 10 has been expanded as in FIG. 3. In addition, block 12 has been expanded to show word line decoders 100, 102, 104, 106 (forming part of decoder 13 of FIG. 1), and memory cells 23. The block select output 32 for block 12 is connected to a respective transistor 110 for each page in block 12. For the purpose of this example, it is assumed that the following address information has been generated for the purpose of an erase operation where it is assumed block0 is block 10, block1 is block 12, page0 is the page associated with decoders 80, 100, page1 is the page associated with decoders 82, 102, page2 is the page associated with decoders 84, 104, and page3 is the page associated with decoders 86, 106:

{block0, page1}, {block0, page2}, erase

Multiple pages being selected will result in the corresponding word line decoders of every block being set. However, if pages within the same block are to be erased (block0 in this example), then the block select will enable only the first block 10, and as such, only pages within that block will be erased, and that is the desired result. Here it is assumed that word line decoders 82, 84 are enabled and therefore produce a "L" output (the erase voltage of the selected cell), and word line decoders 80, 86 are disabled and therefor produce a "H" output. Since pre-decoder outputs are identically connected for every block, corresponding word line decoders for block 12 are enabled and disabled. More specifically, word line decoders 102, 104 are enabled, and word line decoders 100, 106 are disabled. In this example, only block 10 is enabled (block select input is "H") turning on transistors 68, but not turning on transistors 110. The result of this is that "L" outputs of the decoders of block 10 are propagated through to the memory cells 21 of block 10, which will be erased when the erase command is asserted. The "H" outputs produce a floating state meaning no erase occurs. In block 12, none of the outputs of the decoders 100, 102, 104, 106 are propagated through to memory cells 23, and all of the cells have a floating state meaning no erase occurs, and this is the desired result.

Figure 4B:
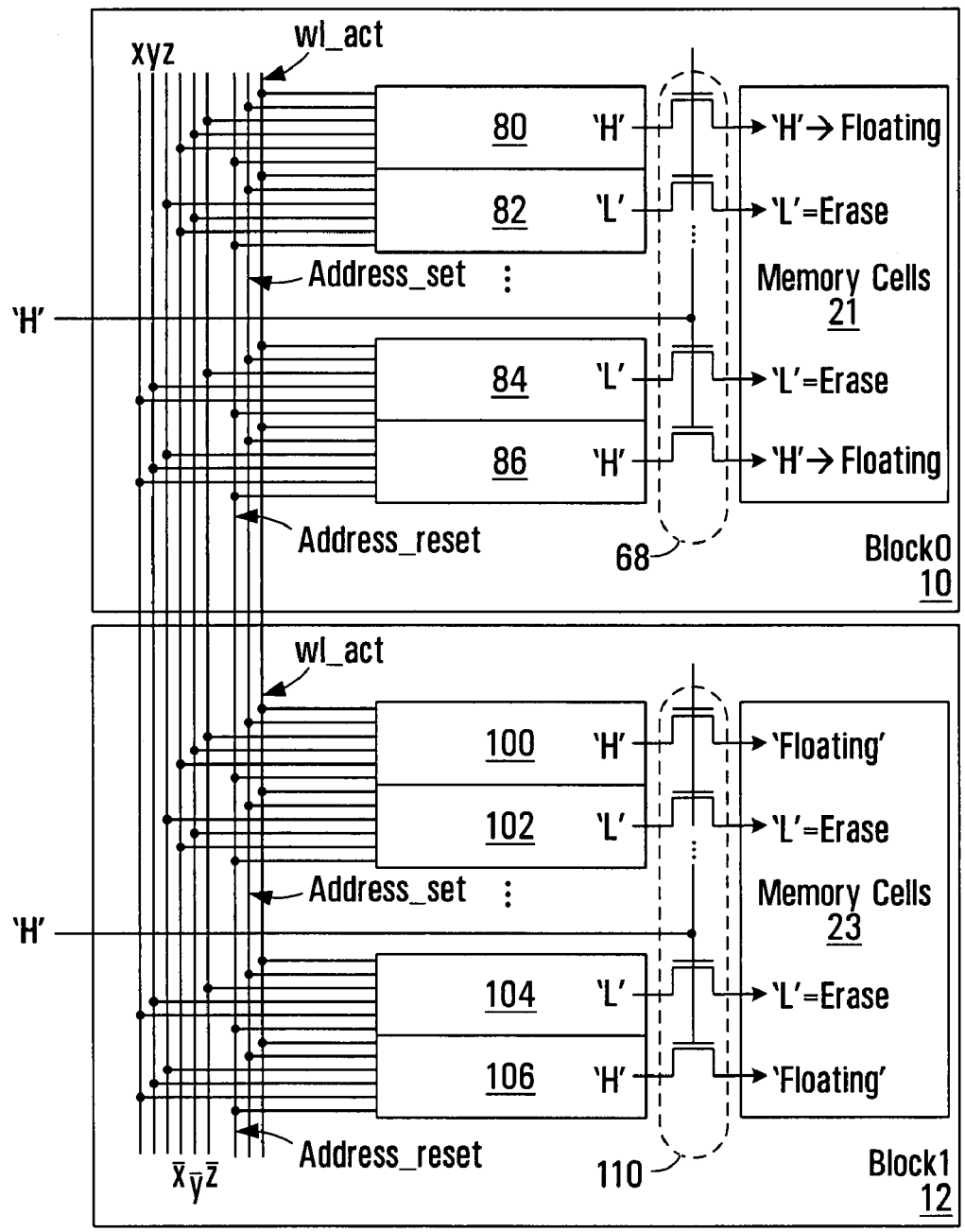
FIG. 4B is a circuit diagram of a flash memory system showing the behaviour when a multiple page erase operation is performed with pages in different blocks.

FIG. 4B shows further details of how a multiple page erase can work properly, when the multiple pages are all within the same block. FIG. 4B shows the same circuit details as FIG. 4A. For the purpose of this example, it is assumed that the following address information has been generated for the purpose of an erase operation:

{block0, page1}, {block1, page2}, erase

Since both blocks are selected, transistors 68 and 110 will all be enabled. Multiple pages being selected will result in the corresponding word line decoders of every block being set. Thus, the outputs of decoders 82, 84, 102, 104 will all be enabled, producing "L" outputs. Since the transistors 68, 110 are all enabled, the erase voltage will be propagated through to the cells 21, 23. The result is that in block0, page1 and page2 are erased AND in block1, page1 and page2 are erased. It is readily apparent that this is more than was to be erased according to the command.

Figure 5:
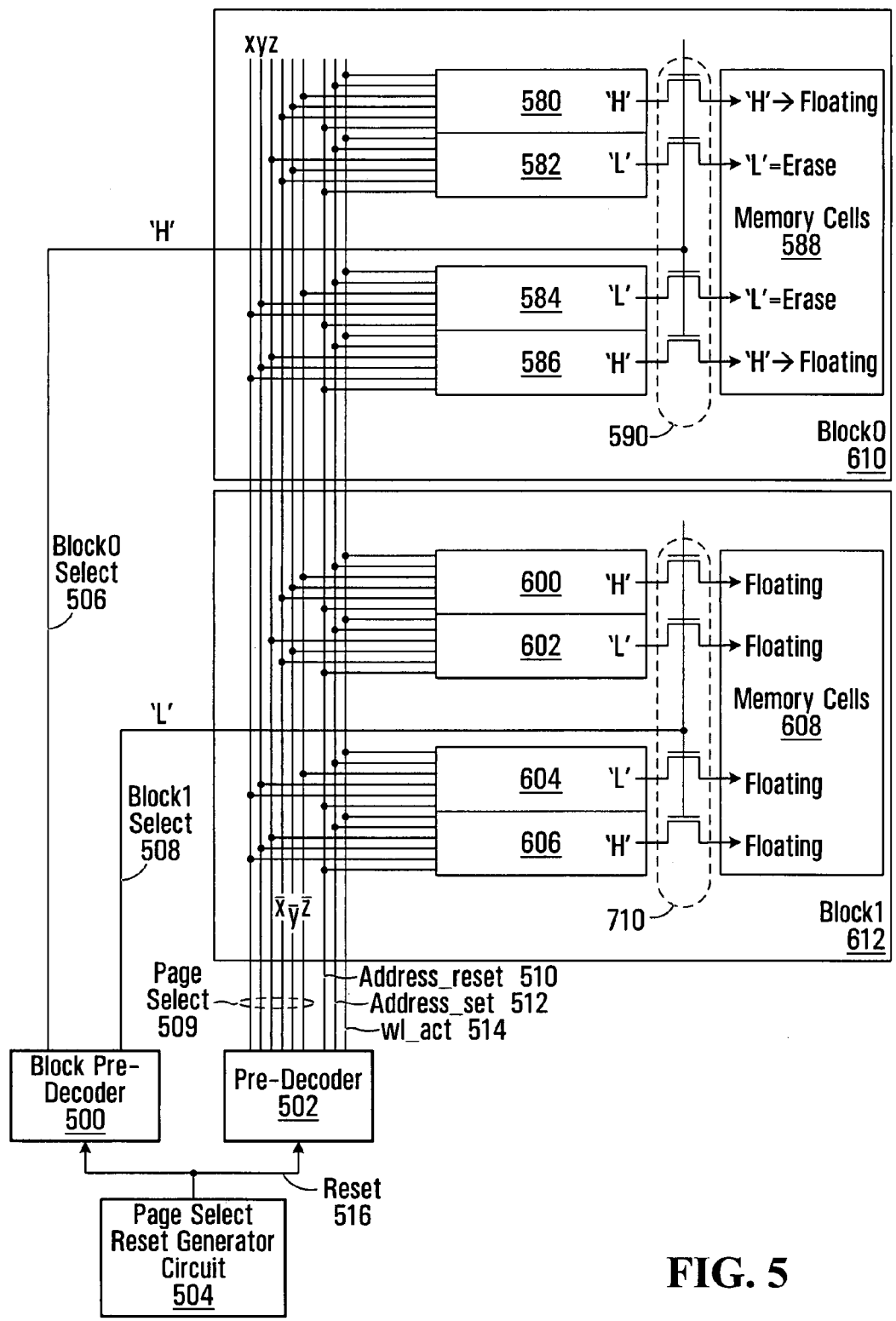
FIG. 5 is a schematic diagram of a flash memory system showing correct behaviour for multiple pages being erased within a single block.
Figure 6A:
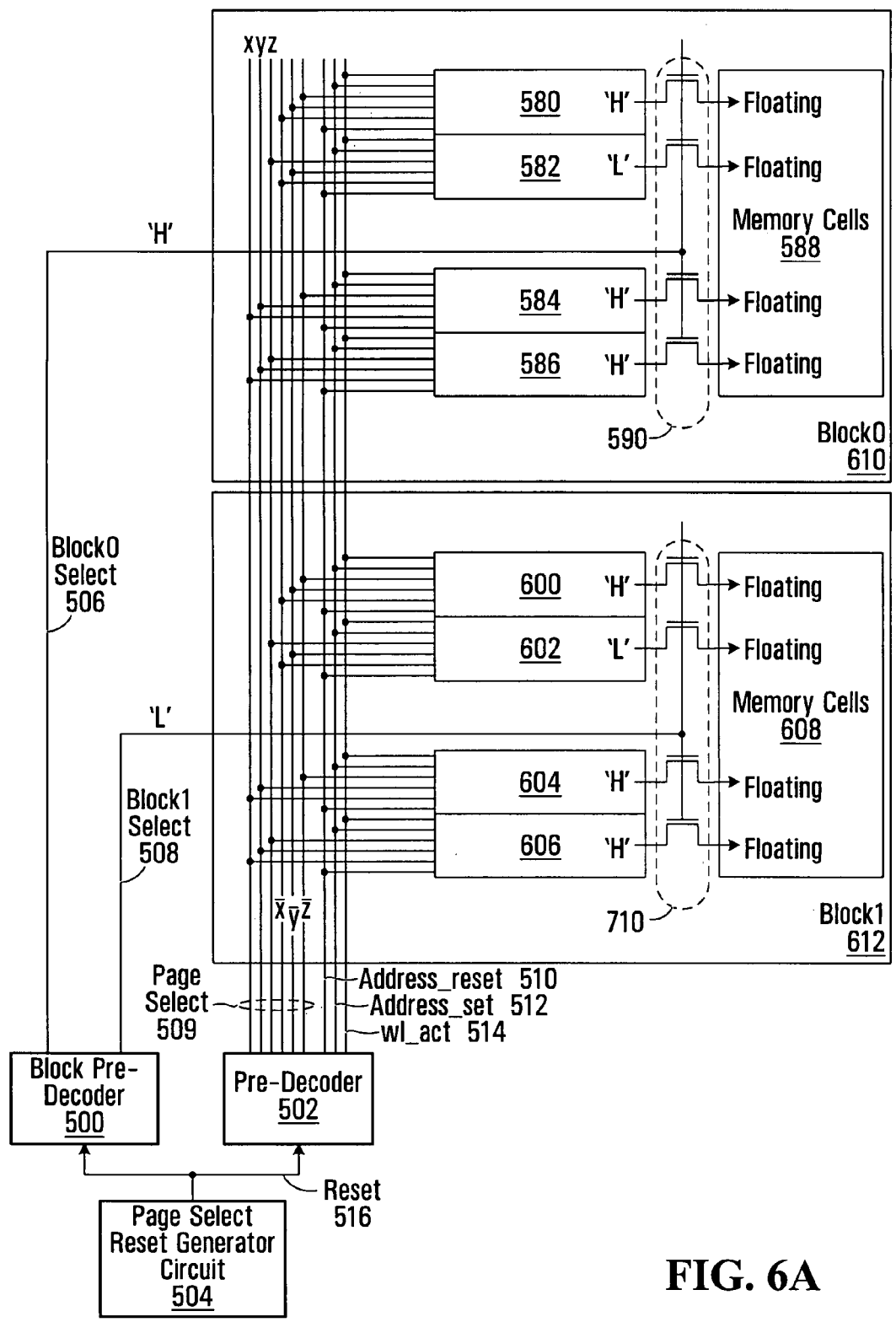
FIGS. 6A and 6B show schematic diagrams of a flash memory system showing a multiple page erase in multiple blocks being attempted, but with page addresses being reset upon detection of a different block.
Figure 6B:
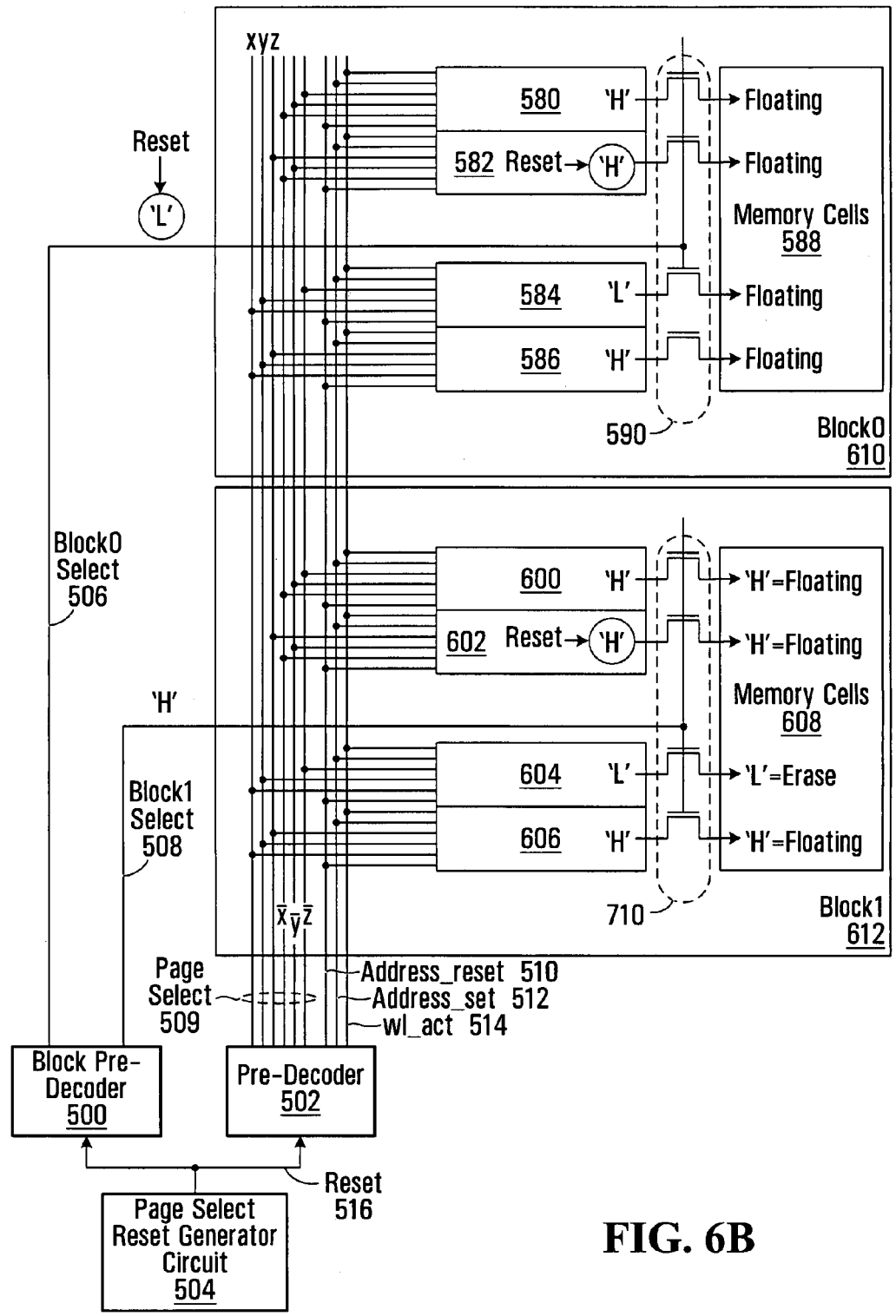

FIGS. 5, 6A and 6B are views of a circuit provided by an embodiment of the invention that provides a page erase functionality. While FIG. 5 shows the circuit processing a multiple page erase command with the pages in the same block, FIGS. 6A and 6B are two views of the same circuit processing a multiple page erase command, with the pages being in different blocks. In the circuits, there are two blocks 610, 612. Block 610 has four pages forming part of memory cells 588. Block 612 has four pages forming part of memory cells 608. More generally, any number of blocks and pages can be present. Block 610 has word line decoders 580, 582, 584, 586 (one per page) connected to memory cells 588 through switching transistors 590. Block 612 has word line decoders 600, 602, 604, 606 connected to memory cells 608 through switching transistors 710. Also shown is a block pre-decoder 500. The block pre-decoder 500 has a block select output 506 connected to enable/disable switching transistors 590 for block 610, and has a block select output 508 connected to enable/disable switching transistors 710. A page pre-decoder 502 is also provided having page select outputs 509 that are commonly connected to corresponding word line decoders in each block as described previously for conventional implementations. The page pre-decoder 502 also has an Address_reset output 510 commonly connected to a reset input of each of the word line decoders, an Address_set output 512 commonly connected to a set input of each of the word line decoders, and a WL_act output 514 that is commonly connected to a WL_act input of the word line decoders. Also shown is page select reset generator circuit 504. This circuit has a reset output 516 that is connected to the page pre-decoder 502, or directly to the address reset 510, and to the block pre-decoder 500.

In FIGS. 5, 6A and 6B, the connections between the block pre-decoder 500 and the blocks can be considered logical interconnections. Generally, any function that allows blocks to be individually selected can be implemented. There may be other logic intervening. For example, for implementations with a large number of blocks (such as 2048 in the example below), block selection may be performed similar to page selection. For example, each block may have a block line decoder that is uniquely addressed by particular bits sent on a set of block select lines. In other words, the set of block line decoders might be similar to a set of word line decoders of a single block. The block line decoders can have a similar reset input for resetting previously latched block addresses.

The page select reset generator circuit 504 is shown as a separate circuit from the page pre-decoder, but they may be implemented as a single circuit. A specific form of page select outputs is shown, but more generally, any type of page select outputs that allows for corresponding pages of the wordline decoders to be selected may be used. Furthermore, while in some embodiments the wordline decoders of FIGS. 5, 6A and 6B are similar in form to the decoders of FIG. 2, more generally, any latching circuits can be employed.

In operation, multiple pages being selected will result in the corresponding word line decoders of every block being set. Assuming the pages are in the same block, the page select reset generator circuit 504 will not generate a reset. After all the addresses have been set, the erase operation is executed, and the erase voltage (0v) will be propagated to the pages of the selected block through the appropriate control of switching transistors (by turning on transistors 590 for block 610, or by turning on transistors 710 for block 612). On the other hand, when the pages are not in the same block, as soon as a different block is detected, the page select reset generator circuit 504 produces a reset on reset output 516 that resets all previously set page addresses and resets block addresses. Subsequent addresses are latched and erased normally assuming they all belong to the same block.

In FIG. 5, an example of a multiple page erase operation in the same block is shown. Here the operation contemplated is:
{Block0, page1}, {Block0, page2} erase Page erase address page1 results in the setting of the latches in wordline decoders 582, 602, and page address page2 results in the setting of the latches in wordline decoders 584, 604. In addition block address Block0 results in block select 506 going to an enable state. Block select 508 stays in the disable state. When the erase operation is executed, the WL_drivers (not shown) in wordline decoders 582, 584, 602, 604 generate the erase voltage for each of page1, page2 in the two blocks 610, 612. In the illustrated example, the erase voltage ("L") is shown being generated for each of the selected pages (page1, page2). The selection of only block0 with block select signals ("H" on input 506 to switching transistors 590 of Block0 610 vs. "L" on input 508 to switching transistors 710 of Block1 612) means that only pages from block0 610 are erased and this is the desired result.

At the instants depicted in FIGS. 6A and 6B, shown are sequential states of the circuit for an example of a multiple page erase operation for page addresses in different blocks. Here the operation contemplated is:
{Block0, page1}, {Block1, page2} erase Page erase address page1 results in the setting of the latches in wordline decoders 582, 602. In addition block address Block0 results in block select 506 going to an enable state. The state of the circuit at this point is depicted in FIG. 6A. The erase voltage has yet been propagated to the memory cells because the erase operation does not get executed until all addresses have been processed and the confirm command 'erase' is not issued yet. After this, when a next page in a different block is tried to be set, the page select reset generator circuit 504 then detects that the block address of the next address is different, since Block1 is different from Block0. At this point, a reset 516 is generated, and this results in previously set latches in the word line decoders being reset (specifically, latches in decoders 582, 602 are reset for this example), and also results in the resetting of block select 506 to a disable state. The second address is then processed normally. In particular, page address page2 results in the setting of the latches in wordline decoders 584, 604. In addition block address Block1 results in block select 508 going to an enable state. Block select 506 stays in the disable state. The WL_drivers (not shown) in wordline decoders 584, 604 generate the erase voltage (0V) for page2 in the two blocks. At this point, the state of the circuit is as depicted in FIG. 6B. The 'H' on block select for block 10 has been reset to 'L', and the page select in wordline decoders 582, 602 has been reset. In the illustrated example, the erase voltage ("L") is shown being generated for the selected page (page2). The selection of only block1 with block select signals ("H" on input 508 to switching transistors 710 of Block1 612 vs. "L" on input 506 to switching transistors 590 of Block0 610) means that only the page from block1 612 is erased and this is the desired result.

Details of example implementations of the page select reset generator circuit 504 will now be provided. In some embodiments, in order to implement the described operations, different block address detection is performed using an ATD (Address Transition Detect) mechanism. It is noted that ATD (address transition detect) has been popularly used in asynchronous DRAM (Dynamic Random Access Memory) and SRAM (Static Random Access Memory) to find the start of a new address. As a function of detected address changes, internal control logic generates the relevant signals in DRAM or SRAM. The pulse width and multiple or single address transitions were critical factors when circuit design of asynchronous DRAM or SRAM was considered and because of this, complicated logic was used to perform the ATD function.

Figure 7:
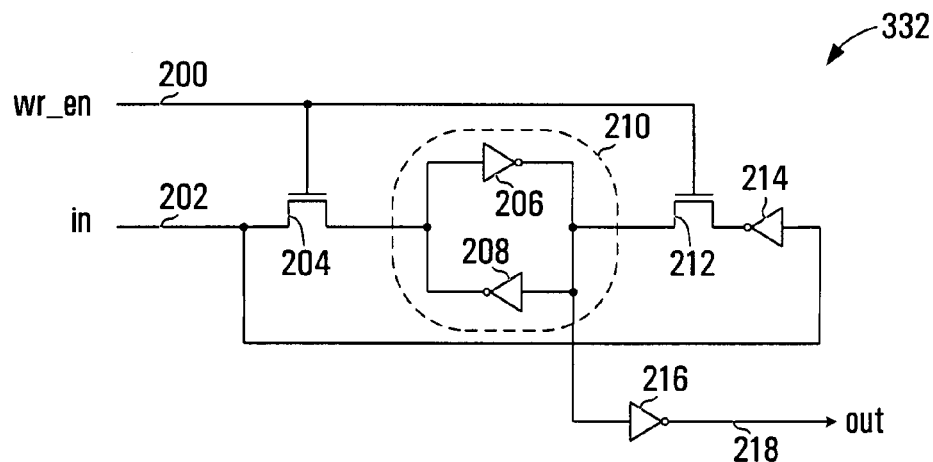
FIG. 7 is a detailed circuit diagram of a sub-address register.

Referring now to FIG. 7, shown is a block sub-address register circuit for latching block addresses forming part of the page select reset generator circuit 504. The circuit of FIG. 7 has a wr_en input 200 connected to enable inputs of transistors 204, 212. There is a block address input 202 that is connected to the set input of a latch 210 consisting of inverters 206, 208 through transistor 204. The block address input 202 is also connected to the reset input of the latch 210 through inverter 214 and transistor 212. The latch 210 has an output that is connected through inverter 216 to produce the overall output 218.

In operation, when the wr_en input 200 is high, transistor 204 is switched on, and a positive transition on the address input 202 sets the latch 210 consisting of inverters 206, 208. So long as wr_en 200 is high, transistor 212 is also switched on, and a negative transition on the address input 202 will reset the latch 210. The latch state is inverted by inverter 216 to produce the output signal 218, this being the latched block address. The circuit of FIG. 7 is replicated as many times as the number of block address bits. In this case, from RA<16:6>, the block address is 11-bits, and so the circuit of FIG. 7 is replicated 11 times. After storing row addresses in the main address registers consisting of block addresses and page addresses (not shown), block addresses are latched into the sub-address register of FIG. 7. The 'wr_en' control signal 200 is generated from a two input combination. The first input, cmd_addip_pgperse signifies that the most recent command is a page erase address input command, and the second input is a Row_latch used in the main address registers placed in register blocks prior to the FIG. 7 sub-address register (not shown). A specific mechanism of combining cmd_addip_pgperse and Row_latch will be detailed below in the description of FIG. 9.

Each sub-address register of FIG. 7 generates a latched block address output 218 only when enabled by wr_en, and this only occurs when processing page erase addresses. As a result, using such a sub-address register, power consumption by unnecessary address transition detection of other command related row addresses can be avoided.

Figure 8:
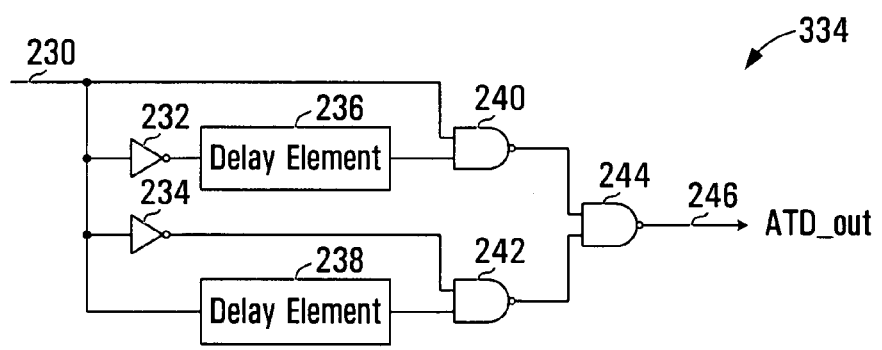
FIG. 8 is a detailed circuit diagram of an ATD (Address Transition Detect) circuit.

An example of an ATD (Address Transition Detect) circuit is depicted in FIG. 8, but it should be clearly understood that many circuits for implementing an ATD function can be alternatively employed. In FIG. 8, the input 230 is one of the latched block addresses 218 produced by one of the circuits of FIG. 7. The circuit of FIG. 8 is also replicated as many times as the number of block address bits. In this case, from RA<16:6>, the block address is 11-bits, and so the circuit of FIG. 8 is replicated 11 times. The input 230 is fed to a first input of a first NAND gate 240, through inverter 232 and delay element 236 to a second input of the first NAND gate 240, through inverter 234 to a first input of a second NAND gate 242, and through delay element 238 to a second input of the second NAND gate 242. The outputs of the first NAND gate 240 and the second NAND gate 242 are fed to respective inputs of a third NAND gate 244 the output of which is an overall ATD_out signal 246. This ATD_out signal is one of the outputs (total 11) that is connected to the input of the ATD merger circuit 340 shown in FIG. 9. More generally, in some embodiments the ATD circuit consists of a first circuit for detecting falling address transitions, a second circuit for detecting rising address transitions, and a circuit for combining the outputs of the first circuit and the second circuit.

In operation, a transition from low to high on the input 230 (rising address transition) will result in a pulse (active low) at the output of NAND gate 240 that lasts the duration of the delay introduced by delay element 236. This generates a corresponding pulse (active high) in the ATD_out 246. A transition from high to low on the input 230 (falling address transition) will result in a pulse (active low) at the output of NAND gate 242 that lasts the duration of the delay introduced by delay element 238. This generates a corresponding pulse (active high) in the ATD_out 246. Thus, the circuit will detect any change in the input 230 and generate a pulse in the ATD_out 246 upon such a detection.

Figure 9:
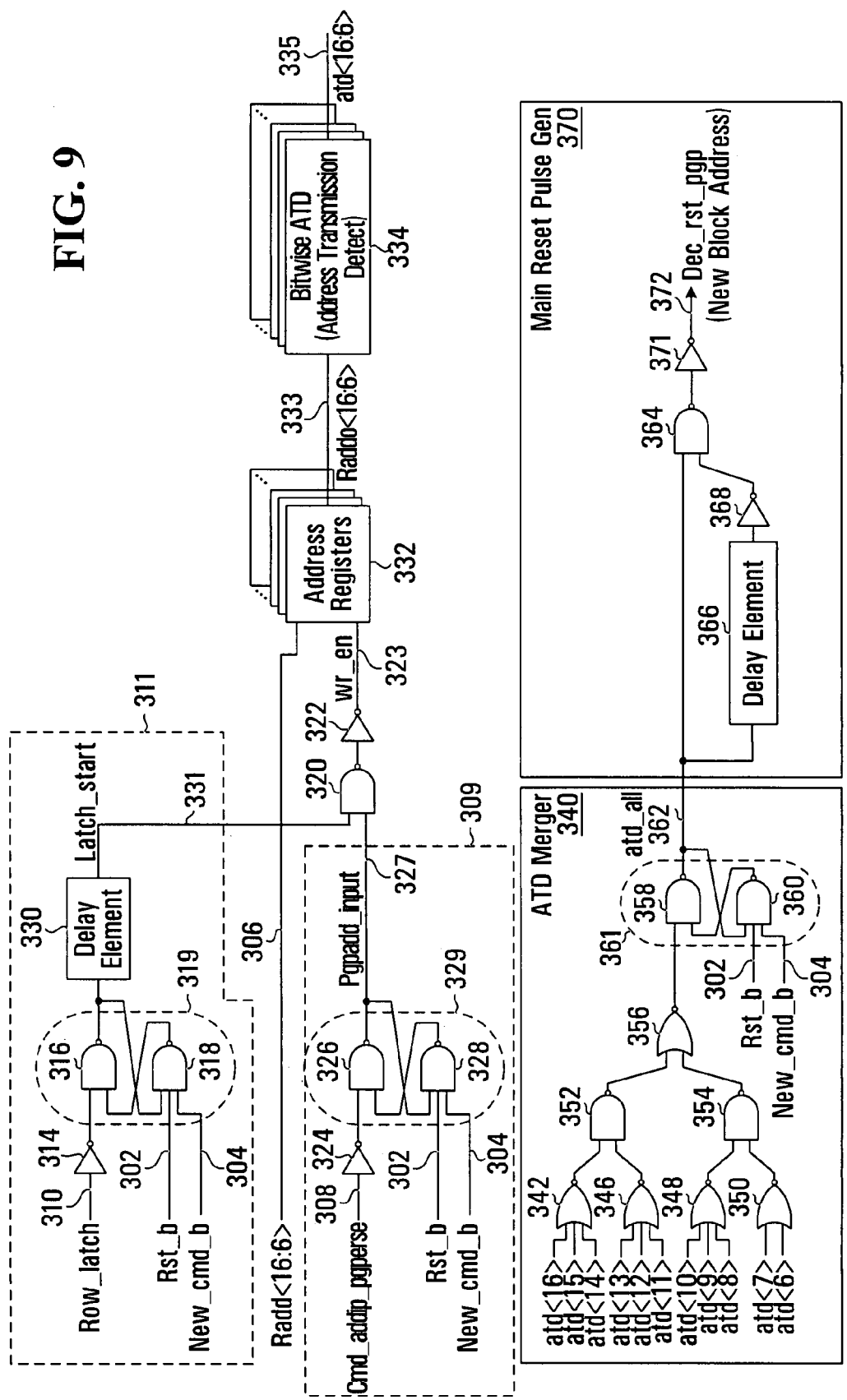
FIG. 9 is a detailed circuit diagram of a circuit that detects when there has been a block address change during a multiple page erase operation, and generates a reset pulse accordingly to reset the page addresses.

FIG. 9 is a block diagram of an overall circuit for detecting new block addresses. This might for example be implemented as the page reset generator circuit 504 of FIGS. 5 and 6. Inputs include Row_latch 310, Rst_b 302 (shown input in two places), New_cmd_b 304 (shown input in two places), Radd<16:6>, Cmd_addip_pgperse 308. Row latch 310 is inverted by inverter 314 and input as a first input to NAND gate 316. Rst_b 302 and New_cmd_b are input to NAND gate 318. NAND gates 316, 318 are connected as an SR latch 319. The output of the SR latch 319 is input to delay element 330. The output 331 of the delay element 330 is labeled Latch_start and this is input to a first input of NAND gate 320. Similarly, Cmd_addip_pgperse 308 is inverted by inverter 324 and input as a first input to NAND gate 326. Rst_b 302 and New_cmd_b 304 are input to NAND gate 328. NAND gates 326, 328 are connected as an SR latch 329. The output 327 of SR latch 329 is labeled Pgpadd_input and this is input to a second input of NAND gate 320. The output of NAND gate 320 is inverted by inverter 322 to produce wr_en 323 which is input to the sub-address registers 332 described previously with reference to FIG. 7. Radd<16:6> functions as the input to the address registers 332. The output 333 of the address registers 332 is Raddo<16:6>, and this is input to the ATD (address transition detect) circuit 334. More specifically, each bit is input to a respective bitwise ATD element, such as shown in FIG. 8. These bitwise ATD signals atd<16:6> 335 are merged with ATD merger circuit 340. A set of bitwise ATD signals are combined with NOR gates 342, 346, 348, 350, NAND gates 352, 354 and NOR gate 356. The output of the last NOR gate 356 is latched in SR latch 361 consisting of NAND gates 358, 360. The second NAND gate 360 receives Rst_b 302 and New_cmd_b 304. The overall merged output atd_all is indicated at 362. The atd_all 362 is input to a main reset pulse generator circuit 370. This is input to a first input of NAND gate 364 directly, and to a second input of NAND gate 364 via delay element 366 and inverter 368. The output of the NAND gate 364 is inverted by inverter 371 to produce an overall output 372 referred to as dec_rst_pgp (new block address).

The operation of the circuit of FIG. 9 will be described now in detail. Before the start of normal operation, rst_b 302 is asserted (i.e. transitions to low) to initialize the states of all latches and to give a clear known output state to each latch and connected logic.

The signal new_cmd_b 304 is generated from command assertion. Whenever any new command is asserted, new_cmd_b 304 is asserted (i.e. transitions to low). This also initializes all latches and connected logic. New operation starts each time a new command is asserted.

There is a pulse on the input cmd_addip_pgperse 308 when a command is the address input of a page erase operation. For example, when "address input for page erase" is asserted through an input port of the device, internal clock latches command bits and a command interpreter decodes the 8-bit command. If the decoded result is 'address input for page erase', 'cmd_addip_pgperse' is issued as a pulse from the command interpreter. This pulse is generated and used to start block address detection to determine whether the block address is a same block or a different block. This input is latched by latch 329. When the output Pgpadd_input 327 of latch 329 is high, this means that Row_latch 310 driving Latch_start 331 is in respect of an address input for a page erase operation.

When an address input of page erase is asserted Pgpadd_input 327 goes high, and Row_latch 310 is generated so Latch_start 331 goes high, and then wr_en 323 (output of inverter 322) goes to high and is reset by a new_cmd_b 304 or rst_b 302. This enables the start of block address transition detection.

The 11 bits Radd<16:6> 306 are the block address portion of an address, and represent bits of a block address that are used as input values of the sub-address registers described previously. This assumes an implementation with 2048 blocks. More generally, any number can be used. These values are stored in the main address register (not shown) using the timing of the Row_latch pulse. In some embodiments, the Radd<16:6> are latched as a function of the Row_latch 310 as well, and as such there is a delay before the block address appears on Radd<16:6>. In order to get the timing margin between Radd<16:6> 306 and wr_en 323, the delay element 330 is provided to obtain Latch_start 331 from the Row_latch input 310.

The Raddo<16:6> output 333 of sub-address registers 332 is then processed by the ATD circuit 334 to produce a respective atd bit per block (atd<16:6> 335) and these are combined with the ATD merger circuit 340 to produce atd_all. In the illustrated example, this consists of 11 individual ATD bits merged to produce a single atd_all output 362. If any one or more of atd<16:6> is high, then atd_all goes high.

When atd_all 362 goes high, the final output is a pulse on dec_rst_pgp 372. This is connected to the row address decoders (also referred to as word line decoder(s)) to reset the latch state in case of accessing a different block page.

Once the reset signal dec_rst_pgp 372 is issued for the first 'address input for page erase' command, the first page address is decoded and the decoded output is latched into the appropriate word line decoders. The reset signal is issued first and then the set signal of the selected decoder latches is issued assuming a change in block address is detected. In the case of consecutive page addresses with the same block address, a further reset signal is not issued. In the case of consecutive page addresses with different block addresses, another reset signal is generated to clear previously latched pages.

In some embodiments a page select reset enable circuit is provided to enable the generation of the reset output timed properly with the latching of addresses in main address registers. For the example of FIG. 9, the circuitry collectively referred to with reference number 311 fulfils this function, but other circuits can alternatively be employed. For example D flip flops instead of SR latches might be used.

In some embodiments a page select reset enable circuit is provided to enable the generation of the reset output when the page addresses are in respect of a multi-page erase operation. For the example of FIG. 9, the circuitry collectively referred to with reference number 309 fulfils this function, but other circuits can alternatively be employed. For example D flip flops instead of SR latches might be used.

Figure 10:
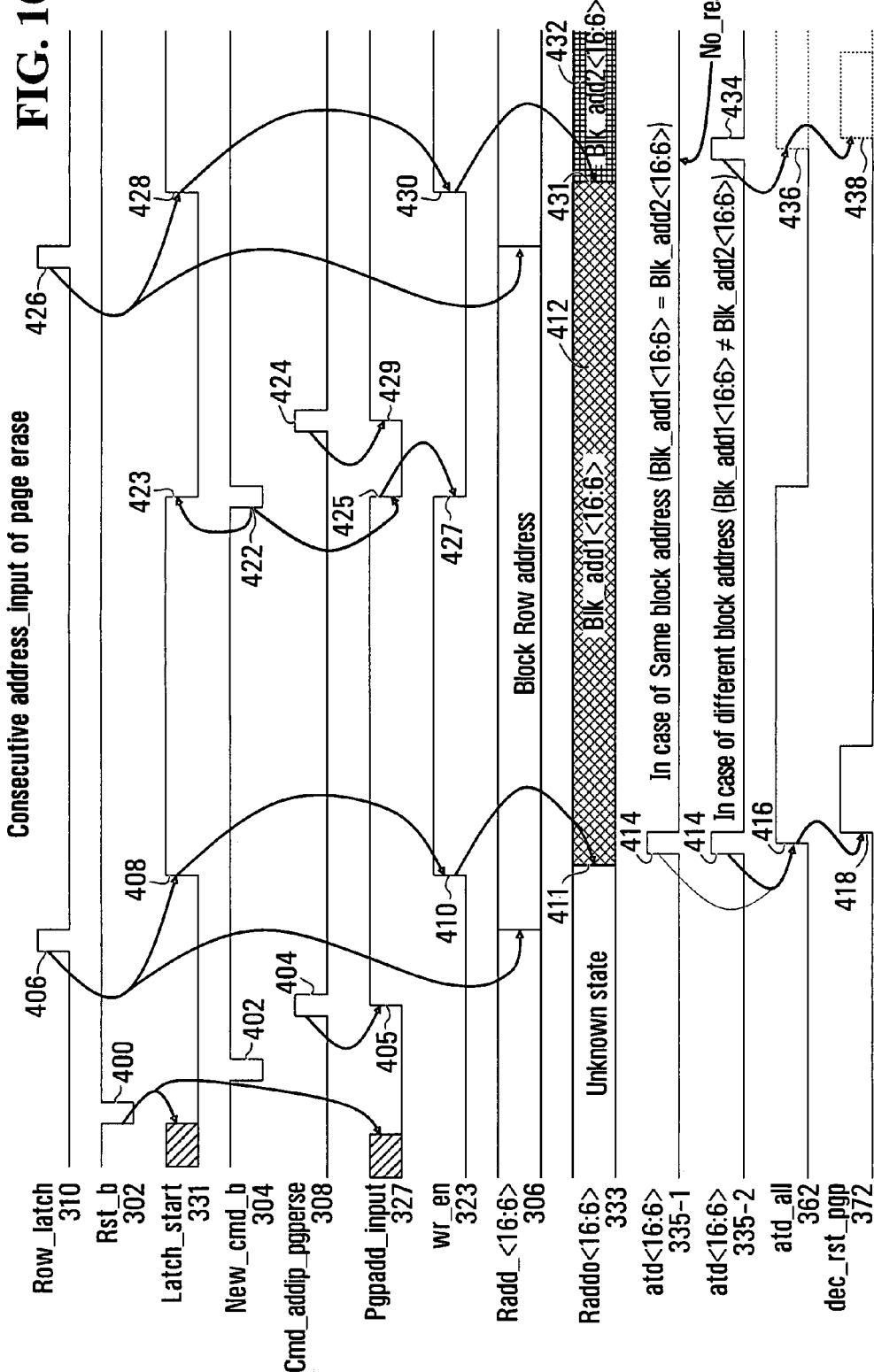
FIG. 10 is a first example of the operation of the circuit of FIG. 9 for consecutive address inputs of a page erase operation.

To further assist in the understanding of the circuit of FIG. 9, two specific operational examples will now be described with reference to FIGS. 10 and 11. Referring first to FIG. 10, this shows an example of how the circuit of FIG. 9 operates when there are consecutive address inputs for a page erase operation. Two cases are shown, one for the case where the two addresses have the same block address, and one for the case where the two addresses have different block addresses. The signals are labeled and numbered the same as in FIG. 9. A shorthand notation has been employed for atd<16:6> in that only a single signal is shown for the atd of a single bit.

Operation is reset by a pulse 400 on Rst_b 302. This produces a known state on Latch_start 331 and Pgpadd_input 327. A start of new command assertion is recognized as signaled by the pulse 402 on New_cmd_b 304. Following this is a pulse 404 on Cmd_Addip_pgperse 308 that indicates that the command is a page erase command. This is latched and produces transition 405 on Pgpadd_input 327. The new command input is followed by a pulse 406 on Row_latch 310 indicating that a first row address has been received. This triggers a transition 408 on Latch_start 331. The combination of high states on Latch_start 331 and Pgpadd_input 327 result in a transition 410 on wr_en 323. In turn, wr_en 323 triggers the latching of the block addresses Radd<16:6> in the sub-address registers 332 at 411.

The block address for the first address are indicated at 412. Given that this is the first address, the new block address will be different from the unknown state. This is signified by a pulse 414 on atd<16:6>, although the pulse would actually occur on one of the 11 atd signals. This is processed by the ATD merger circuit and a pulse 416 is produced on atd_all 362 that in turn generates a main reset pulse 418 on dec_rst_pgp 372. This would reset any latched addresses, but at this point none will have been latched yet. This operation is an initial operation of reset independent of what states there are in the pre-decoder and block-decoder. After the reset operation for the pre-decoder and block pre-decoder, the first received block address and page address are latched as described previously.

Some time later, another new command is received as signaled by the pulse 422 on New_cmd_b 304. This resets the Latch_start 331 (negative transition 423) and the Pgpadd_input 327 (negative transition 425) and resets wr_en (negative transition 427). Following this is a pulse 424 on Cmd_Addip_pgperse 308 that indicates that the command is an address forming part of a page erase command. This is latched and produces transition 429 on Pgpadd_input 327. The new command input is followed by a pulse 426 on Row_latch 310 indicating that an address has been received. This triggers a transition 428 on Latch_start 331. The combination of high states on Latch_start 331 and Pgpadd_input 327 result in a transition 430 on wr_en 323. In turn, wr_en 323 triggers the latching of the block addresses Radd<16:6> in the sub-address registers 332 as indicated at 431.

The block address for the second address is indicated at 432. Given that this is the second address, the new block address may or not be different from the previous block address. For the case that the new block address is the same as the previous block address, the resulting atd<16:6> is depicted at 335-1. This is short hand notation to indicate there is no transition on any one of the atd<16:6> signals. The result is that atd_all is low, and as such there is no main reset pulse. For the case that the new block address is different form the previous block address, the resulting atd<16:6> is depicted at 335-2. There is a pulse 434 on atd<16:6> this being shorthand notation for the occurrence of a pulse on one of the 11 atd signals. This is processed by the ATD merger circuit and a pulse 436 is produced on atd_all 362 that in turn generates a main reset pulse 438 on dec_rst_pgp 372. This will clear the previously latched page address, and the subsequent page address will be latched.

Turning now to FIG. 11, this is an example of the operation of the circuit of FIG. 9 for sequential commands that are not both page erase commands. The example is identical to the example of FIG. 10 for the processing of a first command that is a page erase command, and the description of this will not be repeated. Some time later, another new command start is recognized as signaled by the pulse 422 on New_cmd_b 304. This resets the Latch_start 331 (negative transition 423) and the Pgpadd_input 327 (negative transition 425). This in turn resets wr_en 323 (negative transition 427). Following this, there is no Cmd_Addip_pgperse 308 indicating that the command is a page erase command. The new command input is followed by a first pulse 450 on Row_latch 310 indicating that an address has been received. This does not trigger any further operation of the circuit because it has not been enabled by the required combination of high states on Latch_start 331 and Pgpadd_input 327.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The embodiments above have assumed the use of Flash memory. More generally, non-volatile memory can be employed.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A page select reset generator circuit for limiting multi-page erase operations in non-volatile memory, the page select reset generator circuit comprising:
   an input for receiving block address portions of each address of a set of one or more addresses;
   an address transition detect circuit that detects when block address portions of two addresses of the set of page addresses are different;
   the page select reset generator being operable to generate a reset output for clearing latched pages upon detecting that block address portions of two addresses are different.

2. The page select reset generator circuit of claim 1, for limiting multi-page erase operations in non-volatile memory that is flash memory.

3. The page select reset generator circuit of claim 1 further comprising:
   a first page select reset enable circuit that enables the generation of the reset output when the addresses are in respect of multi-page erase operation.

4. The page select reset generator circuit of claim 1 further comprising:
   a second page select reset enable circuit that enables the generation of the reset output timed properly with the latching of addresses in main address registers.

5. The page select reset generator circuit of claim 1 further comprising:
   a first page select reset enable circuit that enables the generation of the reset output when the page addresses are in respect of multi-page erase operation;
   a second page select reset enable circuit that enables the generation of the reset output timed properly with the latching of addresses in main address registers;
   wherein the page select reset generator is operable to generate the reset output only when enabled by both the first page select reset enable circuit and the second page select reset enable circuit.

6. The page select reset generator circuit of claim 1 wherein the address transition detect circuit comprises:
   for each bit of a multi-bit block address:
      a) a respective sub-address register for registering the bit and producing a registered address output;
      b) a respective bitwise address detection circuit for detecting a transition in the registered address output;
   a merger circuit for combining outputs of the bitwise address detection circuits.

7. A memory circuit comprising:
   a plurality of memory blocks each block comprising non-volatile memory cells arranged in a plurality of pages;
   a respective latching circuit for each page, each page having a page address, the page addresses of the pages being unique within each block, the page address of each page being the same as that of a corresponding page in each other block;
   a respective block enable circuit for each block;
   a block pre-decoder circuit that processes a block address portion of each address of a page erase command by enabling the block enable circuit for the block identified by the block address portion of the address;
   a page pre-decoder circuit that processes a page address portion of each address of a page erase command by setting the latching circuit for each page having the page address identified by the address portion;
   the page select reset generator circuit of claim 1;
   the latching circuits being further operable to connect an erase voltage to the selected pages of the enabled blocks after all addresses of the page erase command have been processed by the block pre-decoder, the page pre-decoder, and the page select reset generator circuit;
   wherein accidental erasure of pages due to a multi-page erase operation relating to two or more different block addresses is prevented.

8. The page select reset generator circuit of claim 6 wherein each bitwise address detection circuit comprises:
   a first circuit for detecting rising address transitions;
   a second circuit for detecting falling address transitions;
   a circuit for combining outputs of the first circuit and the second circuit.

9. The page select reset generator circuit of claim 6 wherein for each bit of the multi-bit block address, the respective sub-address register comprises:
   an SR latch having an input connected to receive the bit;
   an enable circuit for enabling latching of the bit to the SR that enables the generation of the reset output when the page addresses are in respect of multi-page erase operation.

10. The page select reset generator circuit of claim 8 wherein:
   the first circuit for detecting rising address transitions comprises:
   a) an inverter and a delay element connected together in sequence;
   b) a NAND gate having a first input connected to receive one of the registered address outputs, the NAND gate having a second input connected to receive the one of the registered address outputs after inversion by the inverter and delay by the delay element;

the second circuit for detecting falling address transitions comprises:
a) an inverter and a delay element;
b) a NAND gate having a first input connected to receive one of the registered address outputs after inversion by the inverter, the NAND gate having a second input connected to receive the one of the registered address outputs after delay by the delay element.

11. The page select reset generator circuit of claim 8 further comprising:
a main reset pulse generator circuit.

12. The memory circuit of claim 7 wherein the non-volatile memory is flash memory.

13. The memory circuit of claim 7 wherein the latching circuits have a commonly connected reset input for receiving the reset output generated by the page select reset generator.

14. A method comprising:
for each of a plurality of addresses of a multi-page erase operation pertaining to a non-volatile memory, each address containing a block address portion and a page address portion:
a) detecting whether the block address portion differs from that of a previous address of the plurality of addresses;
b) resetting any previous selections of pages and blocks upon detecting that the block address differs from that of a previous address of the plurality of addresses;
c) selecting a respective page in each of a plurality of blocks;
d) selecting a respective one of the plurality of blocks; and
wherein after said detecting, resetting, selecting a respective page, and selecting a respective one of the plurality of blocks on each address, a single remaining block address will be selected, the method further comprising erasing any selected pages in the single remaining selected block.

15. The method of claim 14 further comprising:
generating a reset output to reset the previous selections.

16. The method of claim 14 wherein detecting whether the block address portion differs from that of a previous address of the plurality of addresses comprises:
for each bit of a multi-bit block address:
a) registering the bit into a respective sub-address register;
b) performing bitwise address detection to detect a transition in an output of the sub-address register;
combining outputs of the bitwise address detection.

17. The method of claim 14 applied to flash memory.

18. The method of claim 15 further comprising:
receiving addresses, each address containing a block portion and a page address portion;
for each received address, determining if the address is part of a page erase operation;
performing said detecting and resetting only if the address is determined to be part of a page erase operation.

19. The method of claim 15 further comprising;
latching addresses in main address registers;
timing the generation of the reset output with the latching of addresses in main address registers.

20. The method of claim 16 wherein performing bitwise address detection comprises:
detecting rising address transitions; and
detecting falling address transitions.

\* \* \* \* \*